United States Patent [19]

Gould

[11] Patent Number: 5,047,833

[45] Date of Patent: Sep. 10, 1991

[54] SOLDERABLE FRONT METAL CONTACT FOR MOS DEVICES

[75] Inventor: Herbert J. Gould, Sherman Oaks, Calif.

[73] Assignee: International Rectifier Corporation, El Segundo, Calif.

[21] Appl. No.: 599,148

[22] Filed: Oct. 17, 1990

[51] Int. Cl.⁵ .............................................. H01L 23/54
[52] U.S. Cl. .......................................... 357/71; 357/67
[58] Field of Search ....................... 357/67, 71, 23.4, 42

[56] References Cited

U.S. PATENT DOCUMENTS

| | | | |
|---|---|---|---|
| 4,593,302 | 6/1986 | Lidow et al. | 357/23.4 |
| 4,635,091 | 1/1987 | Roger | 357/71 |
| 4,742,380 | 5/1988 | Chang et al. | 357/23.4 |
| 4,796,084 | 1/1989 | Kamasaki et al. | 357/71 |

Primary Examiner—Rolf Hille
Assistant Examiner—S. V. Clark
Attorney, Agent, or Firm—Ostrolenk, Faber, Gerb & Soffen

[57] ABSTRACT.

A semiconductor device having an MOS-type gate and a main power conduction path through the thickness of the chip has a first main contact on the front surface of the device and a second main contact on the back surface of the device. The contact on the front surface overlies junctions defining the MOSGATE structure and has a solderable electrode. The solderable electrode is enclosed by a dam of amorphous silicon. Solder will not wet amorphous silicon so that the solder is contained within the periphery-defined by the amorphous silicon. The solderable electrode permits heat to be withdrawn from the front surface of the chip and equalizes the current density over all areas underlying the front main contact to prevent hot spots. The solderable contact reduces damage to the cells underlying the front contact as could occur during compression bonding of a lead to a conventional non-solderable aluminum contact.

9 Claims, 2 Drawing Sheets

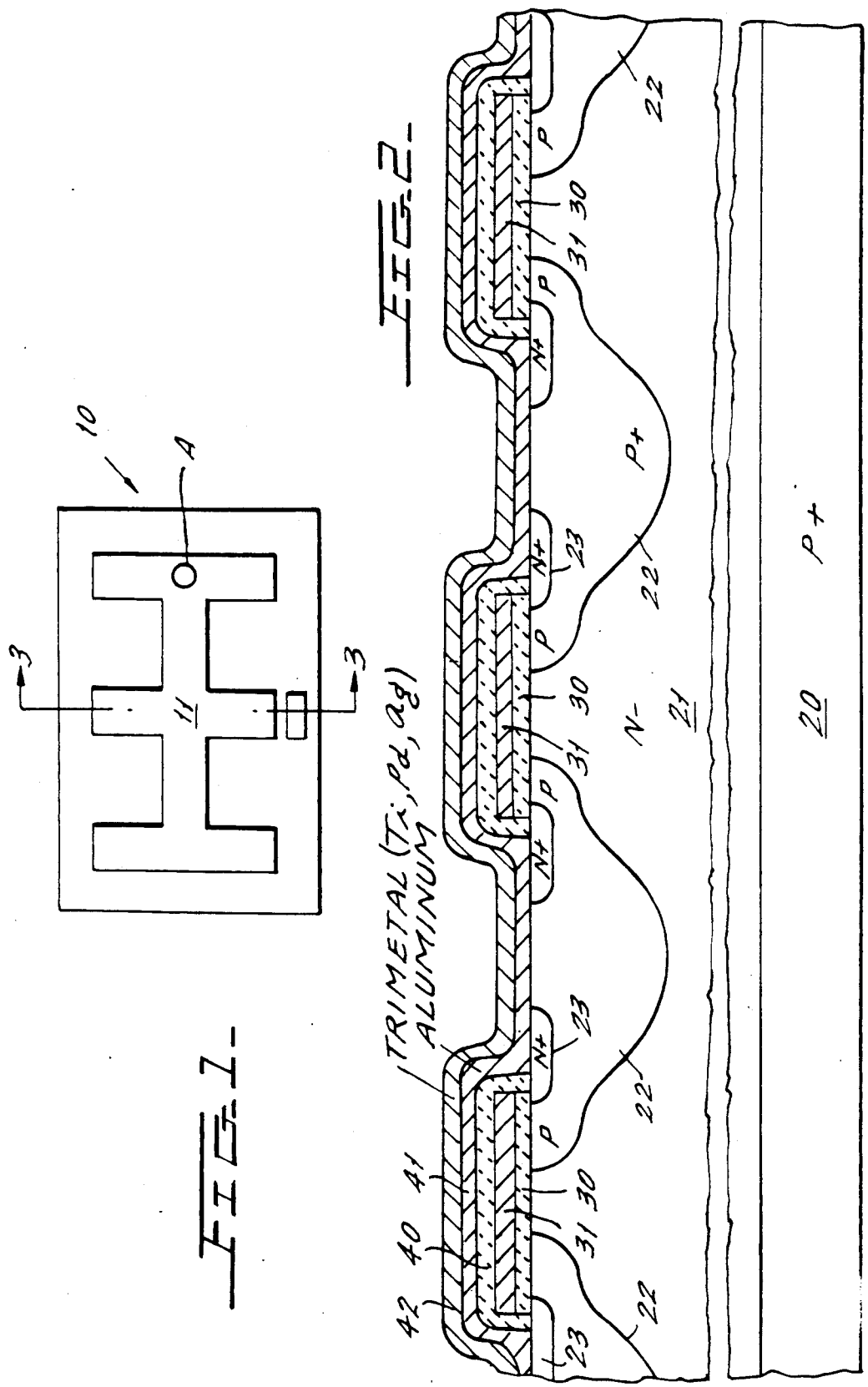

SOLDERABLE FRONT METAL CONTACT FOR MOS DEVICES

BACKGROUND OF THE INVENTION

This invention relates to semiconductor devices, and more specifically relates to a solderable front metal contact for structures employing an MOS type of gate structure.

Many types of MOS devices are well known in which the conduction path through the device is vertical so that one surface, commonly known as the front surface, contains a source or cathode electrode while the rear surface contains a drain or anode electrode. The front or top surface will frequently contain the device gate or control electrode as well. Such MOS devices are power MOSFET devices like the HEXFET MOSFET manufactured and sold by the International Rectifier Corporation, the assignee of the present invention, and the insulated gate bipolar transistor device, also manufactured and sold by the assignee of the present invention. These devices are sometimes referred to hereinafter as "MOSGATE" structures.

The back metal of such devices is a material which can be soldered to a heat sink to remove heat from the chip. However, the front metal used for the source or cathode electrode is traditionally aluminum which is not solderable.

Aluminum front metal is conventionally used for such products because it makes a relatively low-resistance contact to the bare silicon of the chip and lends itself to photolithography processing with considerable accuracy. However, the thin aluminum conventionally used as a source contact and source contact pad in a power MOSFET or as the cathode contact and contact pad in an IGBT-type device tends to have relatively high lateral resistance. The aluminum front contact, therefore, does not provide uniform current distribution in power devices which carry relatively high currents. Furthermore, the aluminum pad does not permit the connection of a relatively massive heat sink conductor to the front surface of the chip to assist in dissipation of heat generated within the chip during its operation. Thus, most of the heat in such devices is removed through the back contact. If it were possible to employ a massive front contact, more heat could be removed from the chip and the same chip can be operated at higher current.

Another disadvantage of the relatively thin aluminum front contact is that the source lead is connected to the pad by a wire-bonding process. During the wire-bonding process, the pressures involved can damage body cells of the device disposed beneath the pad. Thus cells are either not formed under the pad region, significantly reducing the active area, or one runs the risk of damage to the cells during wire bonding.

Known semiconductor devices such as bipolar power transistors and power thyristors have employed solderable contacts on both front and back surfaces so that heat can be removed from such chips from both surfaces. However, in the manufacture of bipolar transistors or other similar high power semiconductor devices having both front and rear solderable contacts, the device surfaces do not require thin aluminum electrodes for their processing and do not contain the complex and fragile junctions of a multicellular nature as required for a MOSGATE-type device.

BRIEF DESCRIPTION OF THE INVENTION

In accordance with the present invention, a novel solderable front contact structure is provided for a MOSGATE structure so that current can be uniformly distributed over the full area of the front contact, and heat can be removed from both surfaces of the chip, and so that device cell elements can be disposed beneath the solder pad areas without fear of damage during an otherwise needed pressure bonding connection of leads to the electrodes.

The invention is particularly important for IGBTs which carry significantly greater currents than equivalent MOSFETs. By way of example, the HEX3 size power MOSFET chip made the International Rectifier Corporation, which is rated at 800 volts, has an on-resistance of 3.2 ohms. An IGBT of the same size and same voltage has an on-resistance of about 0.14 ohm. Thus, theoretically, the IGBT device can carry twenty-two times the current of the equivalent MOSFET and current density is twenty-two times greater. As a practical matter, the IGBT is operated with a current density of about five to ten times greater than that of an equivalent-size MOSFET. Therefore, it is important to ensure even distribution of current over the device surface and to cool the chip as efficiently as possible.

By employing a solderable front electrode, a relatively massive electrode can be used to reduce lateral resistance, thereby to equalize the current density over the electrode surface and eliminate hot spots. It also enables heat removal from the front surface contact as well as the rear surface contact, thus permitting the use of a smaller chip for the same current or a larger current for a given chip size.

Further, the entire surface of the chip under the connection pads can safely include cellular junction elements which make up the MOS portion of the device, since they will not be subjected to possibly damaging pressure during solder connection of the electrodes or leads to the front surface of the device. Moreover, when having a massive solderable electrode for the front electrode of the device, flip-chip type of techniques can be employed in the construction of hybrid-type devices.

The novel process by which the front surface electrode is formed employs the basic process steps for the manufacture of the device junctions. However, after the formation of the insulated gate electrode and the thin aluminum gate and contact layer, a solderable multi-layer metal coating is deposited over the aluminum. By way of example, a solderable tri-metal, which is the preferred solderable metal, is formed by the sequential deposition of titanium, palladium and silver over the aluminum. The titanium bonds well to the aluminum and the palladium enables a connection between the titanium and silver layers and holds the solderable silver layer firmly in place The top silver layer of the tri-metal contact is patterned to the shape of the tri-metal connection pad. A solderable preform, having the shape of the pad, can then be soldered to the pad. A relatively massive heat conductive lead can then be soldered to the preform to make electrical connection to the source pad and to remove heat from the chip.

It should be noted that solder systems other than the tri-metal referred to above could be used. For example, the underlying aluminum can be coated with nickel and the nickel coating followed by a layer of gold. A solder preform can be soldered to the gold to form the upper electrode of the device.

In the preferred embodiment of the invention, an amorphous silicon layer terminates the periphery of the aluminum source and gate electrodes. This amorphous silicon is covered by a photo-polyimide passivation which enables the necessary patterning of the underlying amorphous silicon. Amorphous silicon then encloses or frames the source and gate connection pads on the front surface of the chip.

The solder mass connected to the aluminum pad does not wet the amorphous silicon and, therefore, cannot flow across the amorphous silicon frame. Thus, the amorphous silicon serves as a dam to control the location of the solder mass when it is molten. The photo-polyimide which coats the amorphous silicon is intentionally etched short of the peripheral edge of the amorphous silicon to ensure the proper performance of the damming function.

Other features and advantages of the present invention will become apparent from the following description of the invention which refers to the accompanying drawings.

BRIEF DESCRIPTION OF THE DRAWINGS

FIG. 1 is a top plan view of a typical MOSGATE control device and illustrates connection pads on the top surface of the device.

FIG. 2 is a cross-section of a small portion of the device of FIG. 1 to illustrate the cellular construction employed in the device for an IGBT type of structure.

DETAILED DESCRIPTION OF THE DRAWINGS

Figure 3:
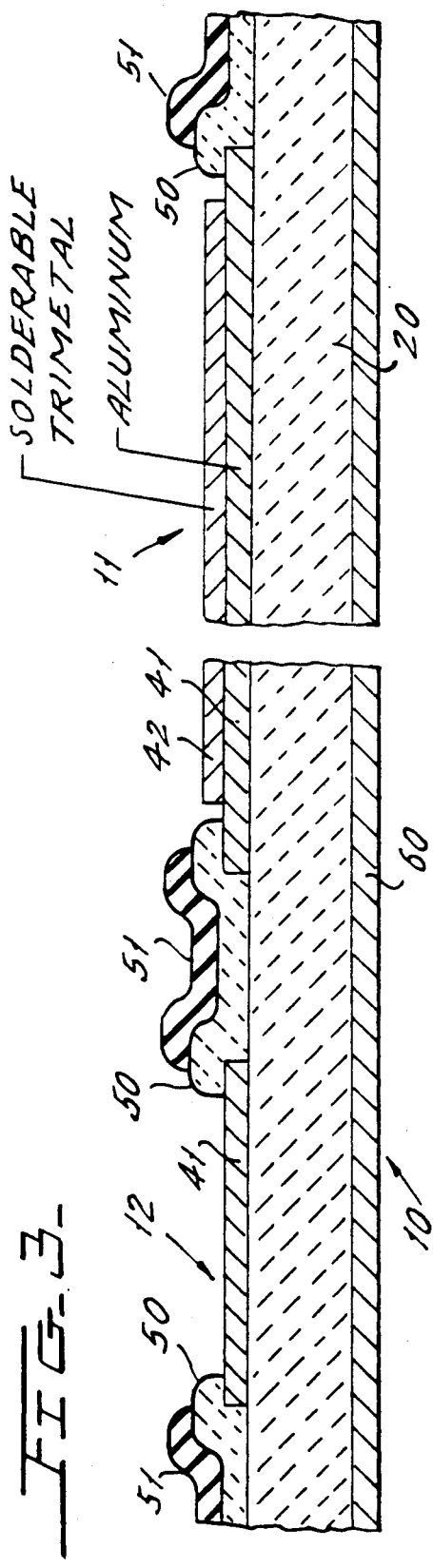
FIG. 3 is a cross-sectional view of FIG. 1 taken across the section lines 3—3 and illustrates an intermediate stage in the process of forming a solderable electrode pad on the front of the chip.

Referring first to FIG. 1, there is illustrated therein the upper surface of a chip 10 which may be an insulated gate bipolar transistor (IGBT). The device is a vertical conduction device and has a main electrode pad 11 on its upper surface and a gate or control electrode pad 12 also on its upper surface but separated from and insulated from the main electrode pad 11. The bottom surface of the chip 10 receives the other main electrode of the device.

FIG. 2 is a cross-section of the region A of FIG. 1 to illustrate the cellular nature of the junctions at the top surface of the chip IGBT device. FIG. 2 also shows the device at an intermediate stage of its manufacture. The MOSGATE junctions can exist beneath the front contact pad area because they are not exposed to pressure damage during lead attachment when using the solderable contact of the invention.

The basic process for the manufacture of the junction patterns in the device shown in FIG. 2 is that disclosed in U.S. Pat. No. 4,593,302 which is assigned to the assignee of the present invention. That patent, however, shows a power MOSFET structure whereas FIG. 2 is a pattern for an IGBT so that the substrate in FIG. 2 is the P+ substrate 20 upon which the N(−) epitaxial layer 21 is grown. In all other respects, the processing for forming the cell structures in the epitaxial layer 21 can be that disclosed in the above-noted patent.

The several cells shown in FIG. 2 are hexagonal in topology. The chip 10 of FIG. 1 may be of the size of a HEX3 chip, sold by the assignee of this invention, and has tens of thousands of such cells distributed over its full surface. Each of these cells consists of a body region 22 which has a central deepened P+ region and an outer lower conductivity P-type region defining the channel region for the device. Each of the P-type regions 22 receives an annular source 23 which is of the N+ conductivity for the N channel device shown in FIG. 2. Note that the conductivity types can be reversed if a P channel device is desired. A grid or lattice of gate oxide is deposited over the surface of the device, with a few gate oxide strips 30 being visible in FIG. 2. These gate oxide strips 30 are covered with conductive polysilicon gate strips 31 which overlie the P-type channels within each of the bodies 22. The entire lattice of polysilicon gate strips 31 is electrically interconnected.

The gate lattice within the device is covered by a silicon dioxide insulation coating 40 which is appropriately patterned and then covered with an aluminum layer 41 which makes contact to the source regions 23 and to the central of the P+ hexagonal body regions. Aluminum layer 41 is relatively thin, for example, from 1 micron to 4 microns. A thicker aluminum layer cannot be used because of the difficulty of etching fine patterns in such thick aluminum. Aluminum layer 41 is also arranged to define a gate pad in contact with the polysilicon gate 31.

In accordance with the present invention, a solderable metal 42 is next deposited atop the aluminum layer 41. This process may take place on the full wafer before chips or die are separated from the wafer. A preferred solderable metal is a tri-metal 42 consisting of layers of titanium, palladium and silver.

The titanium, palladium and silver layers are formed by sequential evaporation although other techniques can be used. By way of example, the titanium layer is deposited atop the aluminum 41 to a thickness of about 1,000 Angstroms. Thereafter, the palladium layer is deposited atop the titanium to a thickness of about 3,000 Angstroms. Finally, the silver layer is deposited atop the palladium and may have a thickness from about 3,000 Angstroms to about 15,000 Angstroms.

Other solderable metal systems can be used in place of the tri-metal 42. Thus, a nickel layer, about 3,000 Angstroms thick, can first be deposited atop the aluminum layer 41 in FIG. 2. A gold layer from 500 to 1,000 Angstroms is then formed atop the nickel. The gold layer is easily solderable as is the silver layer of the tri-metal layer 42 previously described.

Thereafter, the entire wafer is masked and the tri-metal and aluminum surfaces are patterned, etched and passivated as desired, exposing the gate pad and the solderable main electrode pad. A coating of amorphous silicon 50 is then applied over the entire surface of the wafer in FIG. 3 to a thickness of about 1,200 Angstroms. The coating 50 is then covered with a photo-polyimide layer which can be spun to a thickness of 2 to 3 microns. The wafer is then etched as by an appropriate plasma etch to open the window for gate pad 12 in FIG. 3 and window for the main electrode pad 11 in FIG. 3.

The amorphous silicon is employed as a termination structure for the high voltage structure. The photo-polyimide is used as a mask medium and as a hermetic seal over the amorphous silicon termination.

It will be noted in FIG. 3 that the amorphous silicon is cut short of the solderable metal 42 and overlaps only the aluminum layer 41. This is done particularly where the solderable metal is terminated with gold since the gold on silicon will melt at about 370° C. which is somewhat lower than the temperature at which the photo-polyimide is imidized or cross-linked.

Following the plasma etch which opens windows in the amorphous silicon to expose pads 11 and 12, the wafer is subjected to a wet etch, for example, in a de-freckling etch consisting of CF4 plus oxygen. This etch removes scum on the silver at the upper surface of layer 42 in FIG. 3.

Following the plasma etch and de-freckling etch, the photo-polyimide layer 51 is imidized. Thus, the wafer is heated to 420° C. for about 30 minutes in an atmosphere of a hydrogen and nitrogen gas mixture. Thereafter, the wafer is exposed to a 1 to 1 nitric acid and water mixture at 50° C. for about 15 seconds to remove scum from the exposed silver in the tri-metal layer 42. The wafer is then rinsed and baked dry.

Thereafter, a suitable back metal, which may consist of a chrome-nickel-silver layer 60 in FIG. 3, is applied to the back surface of the wafer by any conventional process such as that described in the aforementioned U.S. Pat. No. 4,593,302.

Thereafter a larger solder mass is placed in intimate contact with and soldered to the exposed solderable tri-metal surface in pad area 11. By way of example, a solder-clad molybdenum or tungsten preform can be used. The preform can be a single wafer with severable segments adapted for soldering to each of the front main electrode pads of each chip within the wafer and severed when the wafer is separated into individual chips. Alternatively, preform chips can be applied to individual device chips after separation of the wafer.

A pure solder preform of wafer or chip size and 30 to 40 microns thick may be placed in registry with the main electrode area in pad 11 and between solderable layer 42 and the solder-clad preform. The preform may be 10 mils thick. The assembly may then be placed in a solder oven and heated to cause the solder preform and the solder-clad refractory metal preform to solder together with the upper surface of the solderable tri-metal 42.

Any desired solder material can be used for the solder preform and solder cladding. For example, a lead-indium-silver solder or any similar soft solder can be used. Significantly, the solder will not wet the amorphous silicon 50 and, therefore, the solder of the solder mass shown as the solder mass 70 in FIG. 4 cannot flow into contact with the gate contact 12.

The main wafer is then subdivided into its separate chips and the individual chips are prepared to be housed. Thus, the bottom electrode 60 may be soldered to the heat sink portion of a lead frame and gate and main electrode leads are connected to the gate pad and solderable main electrode pad on the front surface of the chip.

Figure 4:
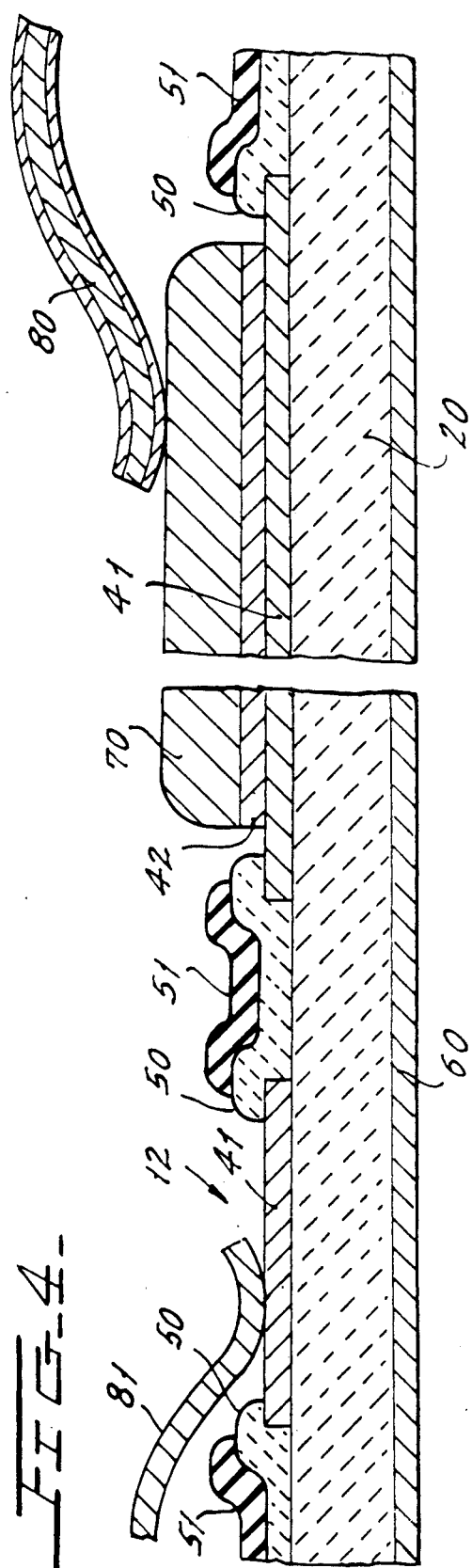
FIG. 4 is similar to FIG. 3 and shows the solder pad in place with a relatively massive lead connected to the solder pad.

A relatively large heat conductive lead 80 can be soldered to the solder mass 70 in FIG. 4. The lead 80, as contrasted to a thin, fragile bonded lead wire used for the gate, is a robust wire of copper or silver, preferably solder-clad as by plating with nickel and gold. This lead can then remove considerable heat from the front surface of the chip to an external massive heat sink as compared to the small amount of heat which is transferred through a prior art pressure-bonded lead to the aluminum contact pad.

It will be noted that, since the gate is not a high current carrying structure, the solderable terminal need not be applied to the gate structure and a simple gate lead 81 can be conventionally bonded to the gate bonding pad in the usual manner.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A MOSGATE structure having a solderable front metal contact; said MOSGATE structure comprising a thin flat chip of silicon having a front surface and a back surface, a first main contact pad on said front surface, a control contact pad on said front surface and spaced from and insulated from said first main contact pad, and a solderable second main contact area extending across the full surface of said back surface; said main contact pad area disposed atop a plurality of spaced junctions in the front surface of said thin flat chip of silicon which define at least a portion of said MOSFET structure, a solderable mass on said contact pad for receiving a main power lead by soldering to said main contact pad, and an amorphous silicon coating on said front surface to define a high voltage termination for said chip; said main contact pad being exposed through a window in said amorphous silicon coating; said amorphous silicon coating being non-wettable by solder and acting as a dam for containing solder on said main contact pad area.

2. A MOSGATE structure having a solderable front metal contact; said MOSGATE structure comprising a thin flat chip of silicon having a front surface and a back surface, a first main contact pad on said front surface, a control contact pad on said front surface and spaced from and insulated from said first main contact pad, and a solderable second main contact area extending across the full surface of said back surface; said main contact pad area disposed atop a plurality of spaced junctions in the front surface of said thin flat chip of silicon which define at least a portion of said MOSFET structure, a solderable mass on said contact pad for receiving a main power lead by soldering to said main contact pad; said first main contact pad comprising a thin layer of aluminum in contact with said silicon; and a solderable metal system atop and in contact with said layer of aluminum; said solderable metal system comprising a tri-metal consisting of titanium atop said aluminum, palladium atop said titanium and silver atop said titanium.

3. The structure of claim 2 which further includes an amorphous silicon coating on said front surface to define a high voltage termination for said chip; said main contact pad being exposed through a window in said amorphous silicon coating; said amorphous silicon coating being non-wettable by solder and acting as a dam for containing solder on said main contact pad area.

4. The structure of claim 2 wherein said first main contact pad further comprises a solder preform comprising a refractory metal and solderable coating soldered to the top of said metal system.

5. The structure of claim 1 wherein said first main contact pad further comprises a solder preform comprising a refractory metal having a solderable coating which is soldered to the top of said metal system.

6. The structure of claim 1 which further includes a thin wire lead, compression bonded to said control contact pad and a second wire of substantially greater cross-sectional area than said thin wire lead soldered to said main contact pad and adapted to remove significant heat from said chip of silicon in comparison to the ability of said thin wire to remove heat from said chip.

7. The structure of claim 1 wherein said first main contact pad comprises a thin layer of aluminum in contact with said silicon and a solderable metal system atop and in contact with said layer of aluminum.

8. The structure of claim 1 wherein said solderable metal system comprises a tri-metal consisting of titanium atop said aluminum, palladium atop said titanium and silver atop said palladium.

9. A MOSGATE structure having a solderable front metal contact; said MOSGATE structure comprising a thin flat chip of silicon having a front surface and a back surface, a first main contact pad on said front surface, a control contact pad on said front surface and spaced from and insulated from said first main contact pad, and a solderable second main contact area extending across the full surface of said back surface; said main contact pad area disposed atop a plurality of spaced junctions in the front surface of said thin flat chip of silicon which define at least a portion of said MOSFET structure, a solderable mass on said contact pad for receiving a main power lead by soldering to said main contact pad; said first main contact pad comprising a thin layer of aluminum in contact with said silicon; and a solderable metal system atop and in contact with said layer of aluminum; said solderable metal system comprising a tri-metal layer.

* * * * *